(12) United States Patent
Vermeulen

(10) Patent No.: US 11,283,327 B2
(45) Date of Patent: Mar. 22, 2022

(54) AIR-COOLED ELECTRIC MOTOR WITH AN ENCLOSED HOUSING

(71) Applicant: Volocopter GmbH, Bruchsal (DE)

(72) Inventor: Tobias Vermeulen, Munich (DE)

(73) Assignee: Volocopter GmbH, Bruchsal (DE)

( * ) Notice: Subject to any disclaimer, the term of this patent is extended or adjusted under 35 U.S.C. 154(b) by 210 days.

(21) Appl. No.: 16/703,004

(22) Filed: Dec. 4, 2019

(65) Prior Publication Data

US 2020/0244139 A1     Jul. 30, 2020

(30) Foreign Application Priority Data

Dec. 13, 2018   (DE) .......................... 102018132145.7

(51) Int. Cl.

| | |
|---|---|
| *H02K 5/18* | (2006.01) |
| *H02K 9/06* | (2006.01) |
| *H02K 9/20* | (2006.01) |
| *B64C 27/08* | (2006.01) |
| *B64D 27/24* | (2006.01) |
| *H01L 35/30* | (2006.01) |

(52) U.S. Cl.
CPC ............... *H02K 5/18* (2013.01); *B64C 27/08* (2013.01); *B64D 27/24* (2013.01); *H01L 35/30* (2013.01); *H02K 9/06* (2013.01); *H02K 9/20* (2013.01)

(58) Field of Classification Search
CPC ................................... H02K 5/18; H02K 9/20
USPC ........................................ 310/60 R, 62, 63
See application file for complete search history.

(56) References Cited

U.S. PATENT DOCUMENTS

| | | | | |
|---|---|---|---|---|
| 4,295,067 A | * | 10/1981 | Binder | ..................... H02K 9/20 |
| | | | | 165/104.26 |
| 6,568,193 B1 | * | 5/2003 | Cahill | ..................... F25B 21/02 |
| | | | | 310/52 |
| 9,077,230 B2 | | 7/2015 | Lau et al. | |
| 2018/0370642 A1 | * | 12/2018 | Imaizumi | ............. B64C 39/024 |

FOREIGN PATENT DOCUMENTS

| | | | |
|---|---|---|---|
| DE | 102011100980 | 5/2012 | |
| EP | 1100182 | 5/2001 | |
| JP | 57085548 A  * | 5/1982 | ............... H02K 9/14 |
| JP | H06169554 | 6/1994 | |
| JP | 2014011815 A  * | 1/2014 | |

OTHER PUBLICATIONS

Machine Translation JP2014011815 (Year: 2014).*

* cited by examiner

*Primary Examiner* — Jose A Gonzalez Quinones
(74) *Attorney, Agent, or Firm* — Volpe Koenig

(57) ABSTRACT

An electric motor (1) is provided, preferably an internal rotor motor, having a housing (3) which is enclosed on all sides, except for a bushing for a drive shaft (2). A stator (5) is arranged in the housing, and is connected to a wall (3a) of the housing (3) in a thermally-conductive manner, wherein, externally to the wall (3a), a plurality of projections (6) are provided, which are oriented essentially parallel to the drive shaft (2), and wherein, externally to the housing (3), a fan wheel (8) is arranged on the drive shaft (2), the vanes (8a) of which, upon a rotation of the drive shaft (2), considered longitudinally to said drive shaft (2), pass over at least one region, in which region the projections (6) are arranged, such that a cooling air stream (KLS) is generated along the projections (6).

17 Claims, 4 Drawing Sheets

AIR-COOLED ELECTRIC MOTOR WITH AN ENCLOSED HOUSING

INCORPORATION BY REFERENCE

The following documents are incorporated herein by reference as if fully set forth: German Patent Application No. 102018132145.7, filed Dec. 13, 2018.

TECHNICAL FIELD

The invention relates to an electric motor, preferably an internal rotor motor, having a housing which is enclosed on all sides, with the specific exception of a bushing for a drive shaft, in which housing a stator and a rotor are arranged.

The invention further relates to an aircraft, specifically to a passenger and/or freight multicopter having a plurality of rotors (propellers), which are drivable or driven by means of electric motors, wherein at least one of said electric motors is configured according to the invention.

BACKGROUND

In the field of electrically-powered motors (electric motors, or simply motors), the employment of a fan for the improved evacuation of heat through the interior of the motor and/or the external surface of the housing is known from the prior art, wherein said fan is driven directly by the electric motor. In this regard, reference may be made, for example, to DE 10 2011 100 980 A1, EP 1 100 182 A1 and JP-H-06169554 A.

The majority of the above-mentioned motors are configured with an open housing, i.e. air is able to flow through the inner parts of the housing, and to cool those components of the motor which are subject to heat-up in service. However, a closed, sealed or enclosed motor housing provides various advantages, in comparison with open housings. Specifically with respect to the insulation of high-voltage-carrying parts, sealed construction provides advantages over open construction. Moreover, in an open structural design, the protection of live parts against corrosion, and against other environmental influences, poses a substantial technical challenge.

However, specifically in the case of a closed motor housing construction, the maintenance of sufficient heat evacuation, based on the available air gap e.g. between the rotor and the housing, and on the grounds of the overall encapsulation of the interior space of the motor (in which correspondingly no exchange of air is possible between the interior and the exterior) poses substantial technical challenges to a person skilled in the art. Insufficient evacuation of heat can result in the necessity for the motor to be (temporarily) switched off. In an application for the propulsion of an aircraft (multicopter), this can be disadvantageously associated with a forced (emergency) landing.

SUMMARY

The object of the present invention is therefore the disclosure of a sealed housing for an electric motor, or of an electric motor having such a housing, which has good heat evacuation properties. It is intended that the electric motor according to the invention is appropriate for use in a preferably passenger and/or freight aircraft, in the form of a multicopter.

This object is fulfilled by an electric motor having one or more characteristics of the invention. Advantageous further developments are disclosed below and in the claims.

In an electric motor according to the invention, preferably an internal rotor motor, having a housing which is enclosed on all sides, with the specific exception of a bushing for a drive shaft, i.e. an enclosed housing, preferably of metal construction, in which housing—additionally to a rotor—a stator is arranged, and is connected to a wall of the housing in a thermally-conductive manner, externally to said wall, i.e. on an outer side of the housing, a plurality of projections are provided, which are essentially oriented parallel to the drive shaft. Moreover, externally to the housing, a fan wheel is arranged on the drive shaft, the vanes of which, upon a rotation of the drive shaft, considered longitudinally to said drive shaft, pass over at least one region, in which region the projections are arranged such that, in this manner, during the operation of the electric motor, a cooling air stream is generated along the projections.

In an aircraft according to the invention, specifically in a passenger and/or freight, vertical take-off and landing multicopter having a plurality of rotors, which are drivable or driven by electric motors, it is provided that at least one electric motor is configured as an electric motor according to the invention.

The solution according to the invention is distinctive, due to the fact that the ratio between the requisite additional weight and the achievable improvement in heat evacuation, in comparison with conventional forced draught ventilation systems and cooling ribs, is significantly improved which, in the particular field of air travel, constitutes a critical advantage.

In a further development of the electric motor according to the invention, it is provided that, between two respectively adjoining projections on the outer side of the housing, at least one additional heat-evacuating element, specifically of metal construction, is arranged, which heat-evacuating element is connected to at least one, and preferably to both of the two adjoining projections in a thermally-conductive manner, most preferably by material bonding, specifically by soldering. Heat-evacuating elements of this type increase the available surface area for the exchange of heat with the environment, thereby improving the cooling capacity.

In another further development of the electric motor according to the invention, it is provided that the cooling air stream flows around the heat-evacuating element. On the grounds of convection, this arrangement generates a further improvement in the cooling capacity.

In order to ensure that an air stream flowing past the heat-evacuating element or the projections is sufficient for the evacuation of the heat generated in the housing, together with the fan wheel, a ventilator is coupled directly to the motor drive shaft. Preferably, a ventilator of this type is arranged with clearance from an axis of rotation of the motor or the drive shaft which is equal to that of the heat-evacuating element(s), such that the cooling air stream in this region is particularly strong.

In yet another further development of the electric motor according to the invention, it is provided that the heat-evacuating element features a relatively large extension in a first direction, and a relatively small extension in a second direction, wherein the first direction is essentially oriented parallel to the drive shaft, and the second direction is essentially oriented transversely to the latter. In this manner, a lamellar arrangement of the heat-evacuating elements (cooling ribs) is achieved, which correspondingly feature a large effective surface area, while showing only a relatively low resistance to the cooling air stream.

In yet another further development of the electric motor according to the invention, it is provided that the latter comprises a plurality of heat-evacuating elements between two adjoining projections, which heat-evacuating elements are spaced apart from one another in the second direction. This configuration enlarges the available surface area in the manner of a cooling rib block, and consequently increases the cooling capacity still further.

In a particularly advantageous further development of the electric motor according to the invention, it is provided that at least two (such) heat-evacuating elements are mutually integrally connected between two (identical) adjoining projections, wherein, preferably, the mutual connection of the heat-evacuating elements is provided in the region of the connection of the relevant heat-evacuating elements to the relevant projection. This permits the achievement of a structural simplification, as the heat-evacuating elements do not require individual connection to the housing or the projections, but constitute a structural unit.

In a likewise advantageous further development of the electric motor according to the invention, it is provided that the at least two connected heat-evacuating elements are constituted by a flat, corrugated or bellows-type folded element (a "corrugated rib"), the corrugation flanks of which constitute the heat-evacuating elements, wherein, preferably, the corrugation flanks are essentially oriented in parallel with an outer surface of the housing, and wherein the connection is provided with a projection in the region of a corrugation vertex. Alternatively, a design in the form of a concertina, with mutually slightly obliquely positioned heat-evacuating elements, or a design with curved heat-evacuating elements are also conceivable, although the invention is not limited hereto. The above-mentioned structural simplification is further reinforced as a result.

In a specifically preferred further development of the electric motor according to the invention, it is provided that a plurality of projections are preferably arranged in an evenly-distributed manner over the circumference of the housing. This permits the further improvement of the cooling effect wherein, correspondingly, heat-evacuating elements can further be provided in turn between two respective projections over the entire circumference.

In another further development of the electric motor according to the invention, it is provided that a clearance between adjoining projections in the circumferential direction is essentially constant, as the distance from the drive shaft increases. Provided that the clearance between projections (or ribs) remains essentially equal, or preferably constant, as the radial clearance from the drive shaft (or the axis of rotation of the motor) increases, standardized corrugated ribs can be employed as heat-evacuating elements, thus impacting positively upon production costs.

The housing can be produced, for example, by milling, or by another appropriate machining method. In yet another further development of the electric motor according to the invention, it is provided that the projection or the projections is/are configured integrally with the housing, preferably of metal construction, or by a machining method, specifically by turning or milling. This provides a compact and stable configuration of the entire arrangement, with good thermal conduction properties. In a further form of embodiment, the housing can also be extruded.

In yet another further development of the electric motor according to the invention, it is provided that the housing is formed of a material having a thermal conductivity greater than or equal to 50 W/(m*K), preferably greater than or equal to 100 W/(m*K), most preferably a metal, specifically aluminum or similar. This permits the achievement of good thermal conduction. Preferably, the heat-evacuating elements (or vanes/corrugated ribs) are also formed of a comparable material.

In an advantageous further development of the electric motor according to the invention, it is provided that the stator is arranged on an inner side of the housing. It can preferably lie in contact with the housing such that, in service, any heat generated is evacuated directly to the housing.

In order to restrict the (additional) air resistance to a minimum, a width of a fan vane (of the fan wheel) can be chosen to be relatively small, and only enlarged in the region of the projections, such that the air resistance remains relatively low. In a corresponding further development of the electric motor according to the invention, it is thus provided that a dimension of the fan wheel in the direction of an extension of the drive shaft—preferably with the exception of the above-mentioned region—is minimized.

In another further development of the electric motor according to the invention, it is provided that at least one additional heat-conducting element is arranged between the stator and the housing, preferably a heat pipe, one end of which is most preferably arranged outside the housing, in the region of the cooling air stream. This permits a further increase in the evacuation of heat from the interior of the housing. In a further form of embodiment, however, a heat pipe can also be configured directly above or below the stator (in the direction of the longitudinal axis). It is also possible for the warm side of the heat pipe to be arranged on the inner side of a housing top cover.

In yet another further development of the electric motor according to the invention, it is provided that at least one additional heat-conducting element is arranged between the stator and the housing, preferably a thermoelectric element having a cold side and a warm side, which cold side is arranged in the direction of an inner side of the housing, whereas a) the warm side is coupled to the housing in a thermally-conductive manner, or b) the warm side is arranged externally to the housing, in the region of the cooling air stream. In this manner, heat can be distributed within the housing, then evacuated. If the warm side is arranged externally to the housing, in the region of the cooling air stream, a correspondingly superior evacuation of heat is achieved. This also applies in the event that the warm side is connected to the housing.

DETAILED DESCRIPTION

Figure 1:
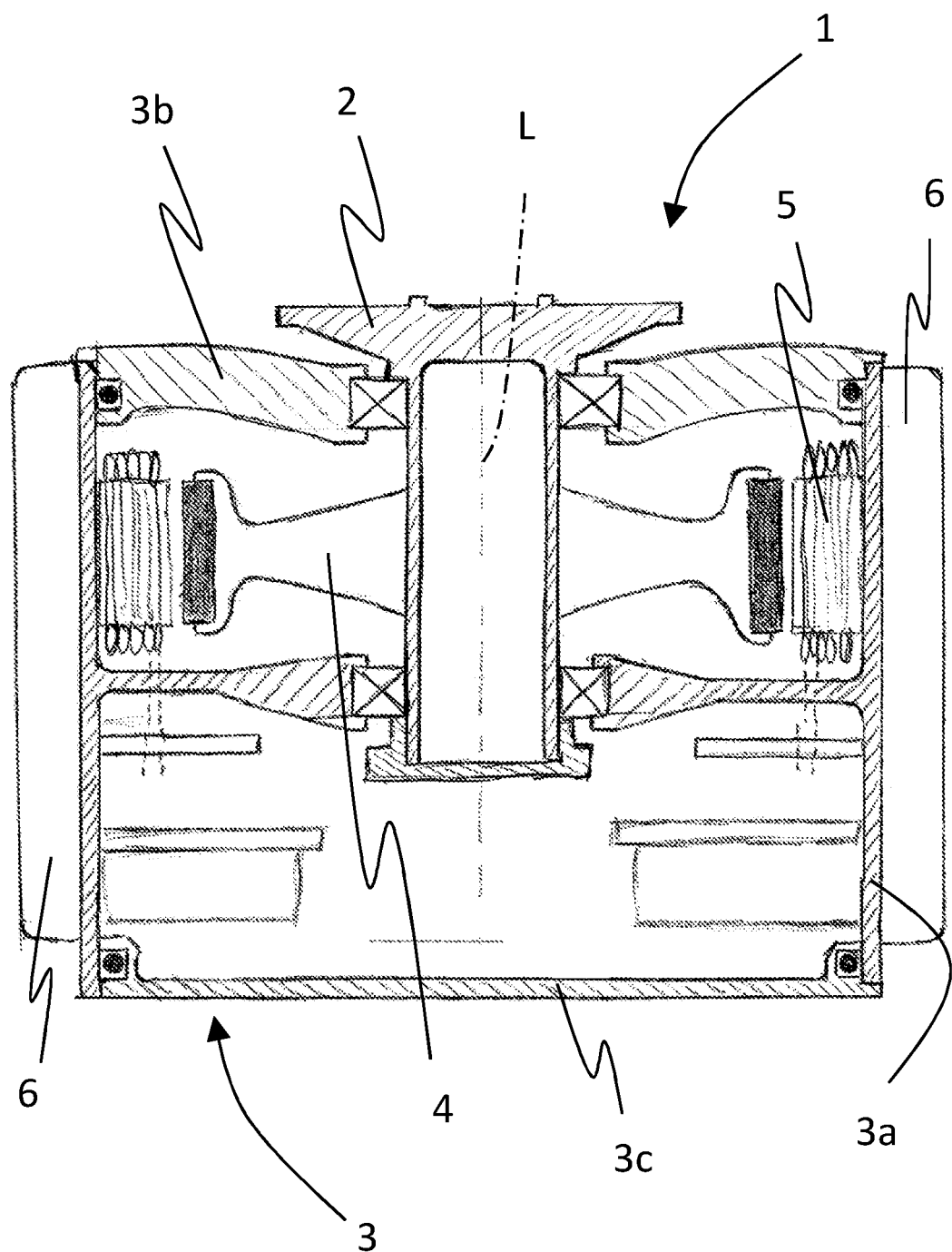
FIG. 1 shows a longitudinal section of an electric motor according to the invention, with no fan wheel as yet.

FIG. 1 shows a longitudinal section of an electric motor according to the invention, with no fan wheel as yet. The electric motor is identified as a whole by the reference number 1, and the longitudinal axis is identified by the reference symbol L. The electric motor 1—not by way of limitation—is configured as an internal rotor motor, and comprises an (enclosed) housing 3, which is closed on all sides, with the exception of a bushing for a drive shaft 2, which housing 3 comprises a cylindrical sidewall or wall 3a, together with a top cover 3b and a bottom cover 3c. In the interior of the housing 3, a rotor identified by reference number 4 is arranged on the inside and a stator identified by reference number 5 is arranged on the outside, wherein the latter is connected from the interior to the wall 3a of the housing 3 in a thermally-conductive and preferably a materially-bonded manner. The rotor 4 is attached rotationally-fixed to the drive shaft 2. The housing 3 is preferably comprised of a metal, e.g. of aluminum, which is light and has good heat-conducting properties. Externally, on the wall 3a or on the housing 3, a plurality of projections 6 are provided, of which, in FIG. 1, on the grounds of the representation selected, only two are visible. Preferably, corresponding projections (or ribs) 6 are arranged in a regularly spaced distribution about the circumference of the housing 3. The projections 6 are essentially oriented parallel to the drive shaft 2 or the longitudinal axis L, which longitudinal axis L coincides with an axis of rotation of the electric motor 1 or of the drive shaft 2.

Figure 2:
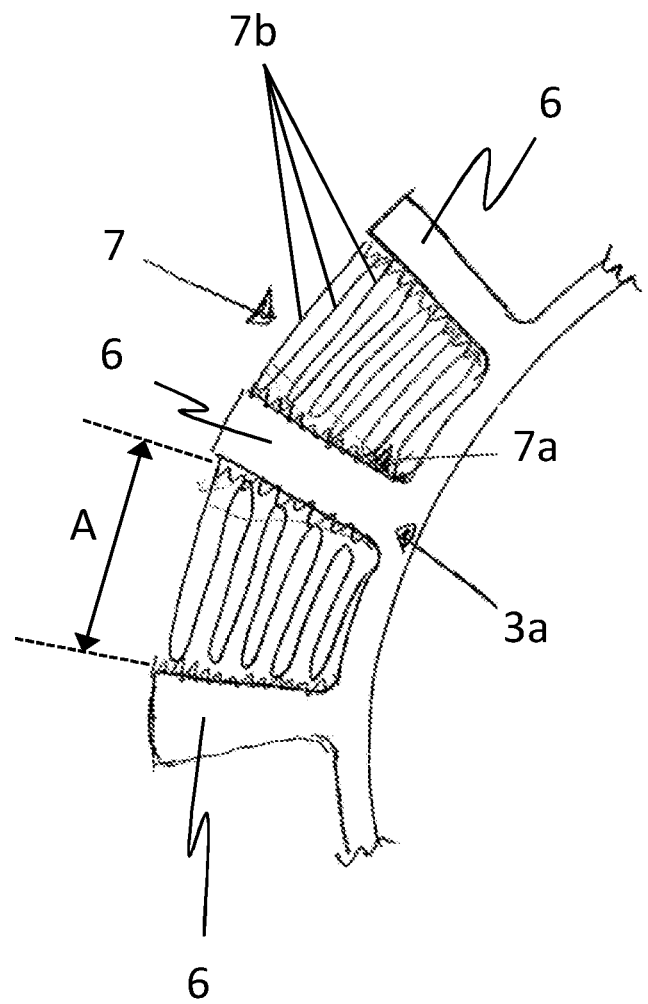
FIG. 2 shows detail of the electric motor represented in FIG. 1, viewed from above, parallel to the axis of rotation of the drive shaft.

FIG. 2 represents an overhead view of three of the above-mentioned projections or ribs 6, considered in a viewing direction parallel to the longitudinal axis L (FIG. 1). These are arranged externally to the housing wall 3a, and are equally spaced from one another. Preferably, the projections 6 expand as they extend outwards, such that a clearance A between two adjoining projections 6, as the distance from the longitudinal axis (FIG. 1) increases, essentially remains constant. Between each of the two adjoining projections 6, a corrugated structure of folded sheet metal 7 is arranged, for the constitution of "corrugated ribs". The latter, in the region of their corrugation peaks, identified by reference number 7a, are preferably connected to the projections 6 in a materially bonded manner, specifically by soldering. The individual ribs 7b constitute heat-evacuating elements and, as such, are configured in the manner of vanes, wherein they essentially extend in the direction of the longitudinal axis L (FIG. 1). FIG. 2 shows the view of the narrow (upper) edge of the ribs 7b.

Figure 3:
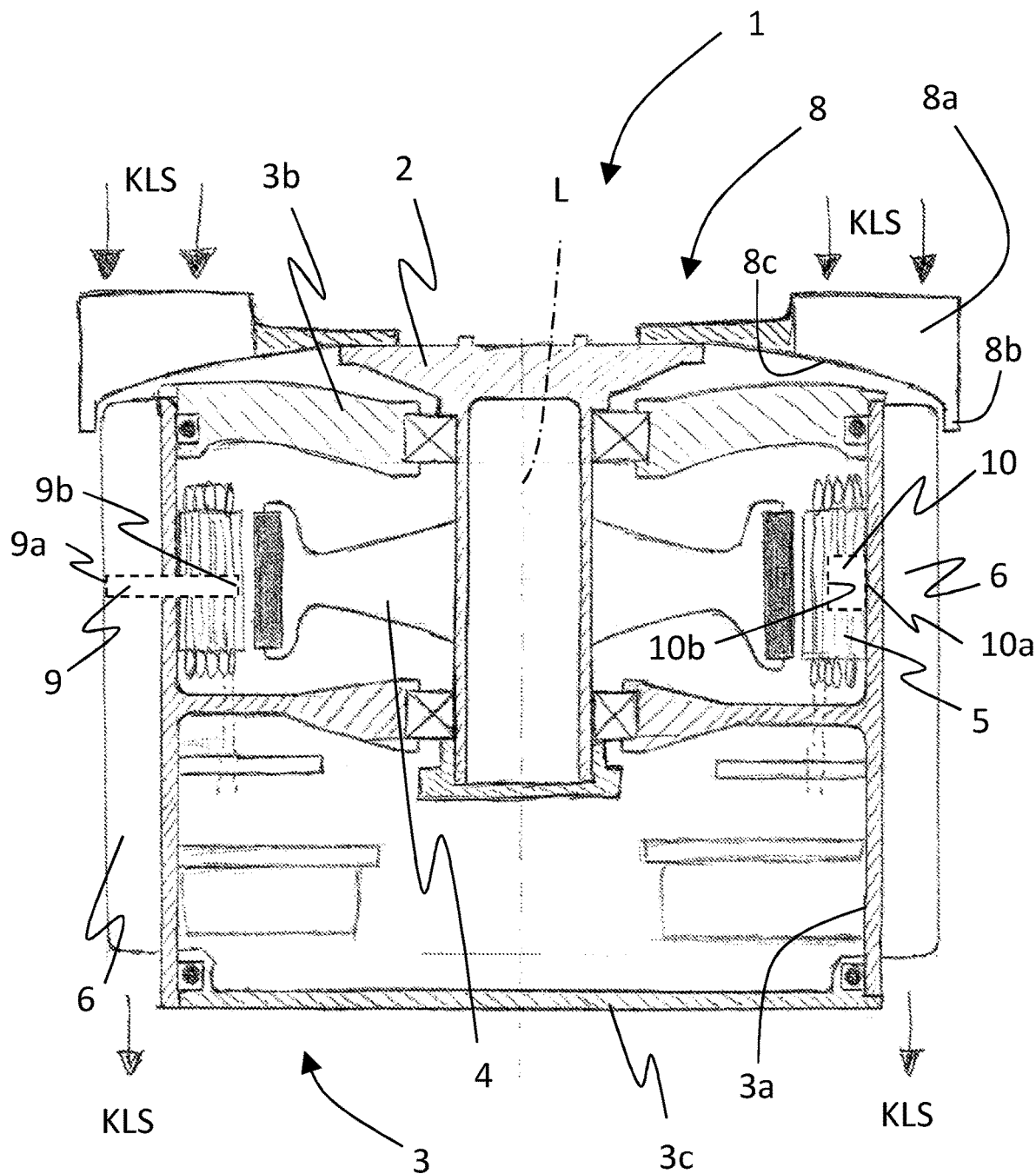
FIG. 3 shows a longitudinal section of an electric motor according to the invention, as represented in FIG. 1, with a fan wheel.

In the operation of the electric motor 1, the rotor 4 rotates within the stator 5, thereby resulting in a rotation of the drive shaft 2 and, accordingly, the delivery of a corresponding driving moment or torque. This specifically results in the heat-up of the stator 5, wherein the heat generated is evacuated to the wall 3a, and from thence to the projections 6 and the corrugated ribs 7 (by thermal conduction). In order to now efficiently further evacuate the heat, externally to the housing 3, a fan wheel (or ventilator wheel) 8 is arranged on the drive shaft 2, as represented in FIG. 3. During a rotation of the drive shaft, the vanes 8a thereof, considered longitudinally to the drive shaft, at least pass over the region, in which region the projections 6 and the corrugated ribs 7 are arranged (FIG. 2), in order to generate a cooling air stream along the projections 6 or corrugated ribs 7.

The vanes 8a of the fan wheel 8—transversely to the longitudinal axis L—in the connecting region to the drive shaft 2, are initially configured as relatively thin (narrow), and then expand in the above-mentioned region, in order to efficiently generate a cooling air stream (arrows KLS) along the projections 6 and the corrugated ribs 7 at this location, or along the individual ribs or heat-evacuating elements 7b (FIG. 2), whilst minimizing the overall air resistance of the vanes 8a to the greatest possible extent. This corresponds to a specific further development of the electric motor according to the invention, wherein a dimension of the fan wheel in the direction of an extension of the drive shaft 2—preferably with the exception of the above-mentioned region—is minimized. The vanes 8a, at their lower and outer free ends, identified by reference number 8b, incorporate an extension, which overlaps the projections 6 in the longitudinal direction. A lower outline of the vanes 8a (identified by reference number 8c) is matched as closely as possible to a (notional) external outline of the housing 3, in order to reduce unwanted air fluxes.

Identified by reference number 9 and shown schematically is an additional and optional heat-conducting element, which is arranged between the stator 5 and the housing 3, preferably a heat pipe, one (external) end of which 9a is most preferably arranged externally to the housing 3, in the region of the cooling air stream KLS (e.g. between two projections 6), whereas the other end 9b is arranged within the housing 3, in the region of the stator 5.

In a further form of embodiment, however, a heat pipe can also be configured directly above or below the stator 5 (in the direction of the longitudinal axis L). It is also possible for the warm side to be arranged on the inner side of the housing top cover 3b.

Identified by reference number 10 and shown schematically is an optional thermoelectric element, having a cold side 10b and a warm side 10a wherein, preferably, the cold side 10b is arranged in the direction of the longitudinal axis L, away from the wall 3a of the housing 3, whereas the warm side 10a is connected to the housing 3 or to the wall 3a in a thermally-conductive manner. Alternatively, the warm side 10a can be arranged externally to the housing 3, in the region of the cooling air stream KLS, although this would only be technically feasible at the cost of a penetration in the housing 3, which is disadvantageous per se.

Figure 4:
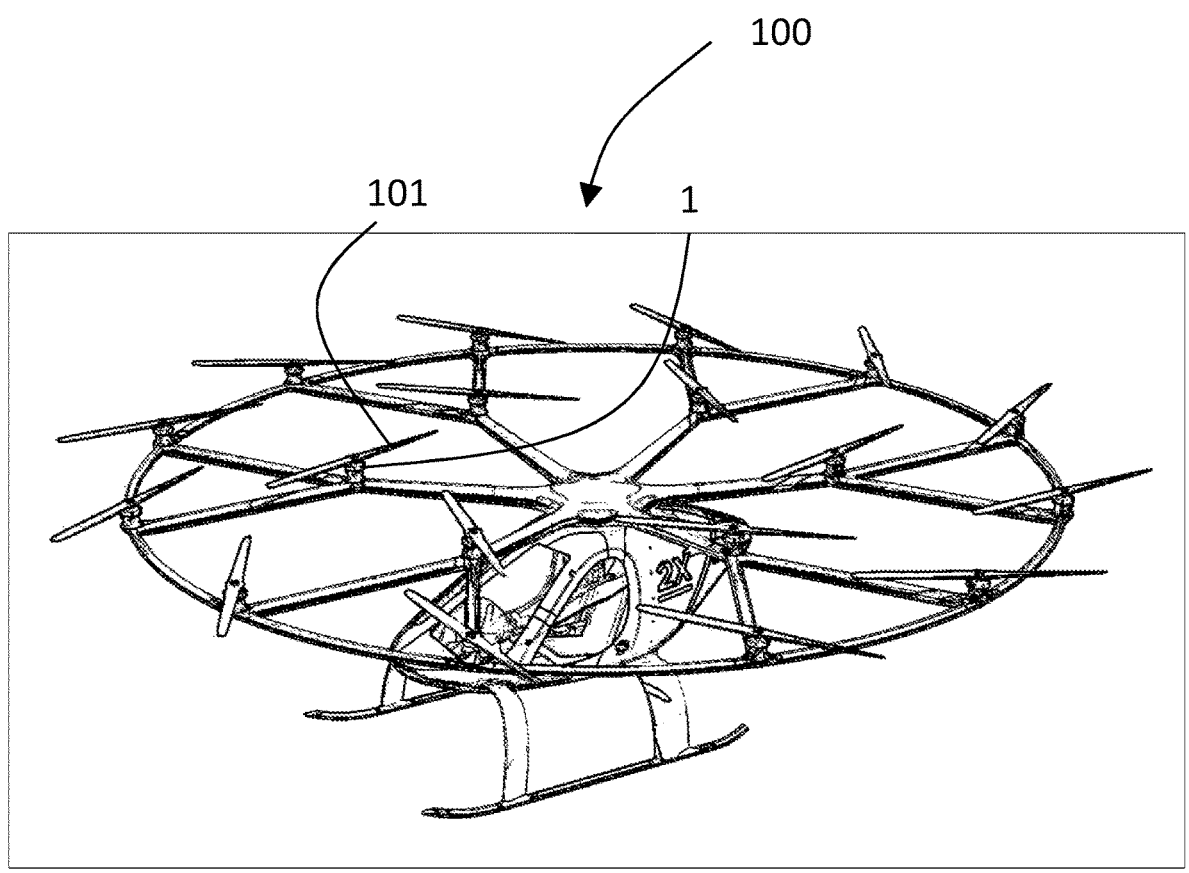
FIG. 4 shows a preferred application of the electric motor according to the invention, in a passenger multicopter.

Finally, FIG. 4 shows by way of example the preferred application of the electric motor 1 in a passenger and/or freight multicopter 100, produced by the firm of the applicant, as a drive system for a rotor (propeller) 101. In FIG. 4, in the interests of clarity, only one motor 1 and only one propeller 101 are explicitly identified. However, there are 18 such corresponding units, as represented.

The invention claimed is:
1. An electric motor (1), comprising:
   a drive shaft (2),
   a housing (3) which is enclosed on all sides, except for a bushing through which the drive shaft (2) extends,
   a stator (5) arranged in the housing (3), the stator is connected to a wall (3a) of the housing (3) in a thermally-conductive manner,
   a plurality of projections (6) provided externally to said wall (3a), the plurality of projections (6) are oriented essentially parallel to the drive shaft (2),
   a fan wheel (8) arranged externally to the housing (3) on the drive shaft (2), the fan wheel including vanes (8a) which, upon rotation of the drive shaft (2), pass over at least one region, in which region the projections (6) are arranged, such that a cooling air stream (KLS) is generated along the projections (6),
   at least one heat-evacuating element (7, 7b) is arranged between two respectively adjoining projections (6), said heat-evacuating element (7, 7b) is connected to at least one of the two adjoining projections (6) in a thermally-conductive manner,
   wherein the heat-evacuating element (7, 7b) includes a relatively larger extension in a first direction, and a relatively smaller extension in a second direction, and the first direction is oriented essentially parallel to the drive shaft (2), and the second direction is oriented essentially transversely to the first direction, and there are a plurality of heat-evacuating elements (7*b*) between two adjoining ones of the projections (6), said heat-evacuating elements (7*b*) are spaced apart from one another in the second direction.

2. The electric motor of claim 1, wherein the electric motor is an internal rotor motor.

3. The electric motor of claim 1, wherein the heat-evacuating element (7, 7*b*) is connected to at least one of the two adjoining projections (6) in a thermally-conductive manner by material bonding.

4. The electric motor (1) as claimed in claim 2, wherein the cooling air stream (KLS) flows around or through the heat-evacuating element (7, 7*b*) during operation.

5. The electric motor (1) as claimed in claim 1, wherein at least two of the heat-evacuating elements (7*b*) are mutually integrally connected between two adjoining ones of the projections (6), and the connection is provided in a region of the connection of the relevant heat-evacuating elements (7*b*) to the one projection (6).

6. The electric motor (1) as claimed in claim 5, wherein the at least two connected heat-evacuating elements (7*b*) are formed of a flat, corrugated or bellows-type folded element (7), corrugation flanks of which comprise the heat-evacuating elements (7*b*), and the corrugation flanks are essentially oriented in parallel with an outer surface of the housing (3), and the connection is provided with a projection in a region of a corrugation vertex (7*a*).

7. The electric motor (1) as claimed in claim 1, wherein a plurality of the projections (6) are arranged in an evenly-distributed manner over a circumference of the housing (3).

8. The electric motor (1) as claimed in claim 7, wherein a clearance (A) between adjoining ones of the projections (6) in a circumferential direction is essentially constant, as a distance from the drive shaft (2) increases.

9. The electric motor (1) as claimed in claim 1, wherein the projections (6) are configured integrally with the housing (3).

10. The electric motor (1) as claimed in claim 1, wherein the projections (6) are configured integrally with the housing (3) by machining, turning, milling, or are formed by as extrusion.

11. The electric motor (1) as claimed in claim 1, wherein the housing (3) is formed of a material having a thermal conductivity greater than or equal to 50 W/(m*K).

12. The electric motor (1) as claimed in claim 1, wherein the stator (5) is arranged on an inner side of the housing (3).

13. The electric motor (1) as claimed in claim 1, wherein a dimension of the fan wheel (8), in a direction of an extension of the drive shaft (2), is minimized.

14. The electric motor (1) as claimed in claim 1, wherein at least one additional heat-conducting element (9) is arranged between the stator (5) and the housing (3).

15. The electric motor (1) as claimed in claim 14, wherein the at least one additional heat-conducting element (9) is a heat pipe, one end (9*a*) of which is arranged outside the housing (3), in the region of the cooling air stream (KLS).

16. The electric motor (1) as claimed in claim 1, wherein at least one additional heat-conducting element (10) is arranged between the stator (5) and the housing (3), comprising a thermoelectric element having a cold side (10*b*) and a warm side (10*a*), said cold side (10*b*) is arranged in a direction of an inner side of the housing (3), and
  a) the warm side (10*a*) is coupled to the housing (3) in a thermally-conductive manner, or
  b) the warm side (10*a*) is arranged externally to the housing (3), in a region of the cooling air stream (KLS).

17. An aircraft (100) having a plurality of rotors (101), which are drivable by a plurality of electric motors (1), and at least one of the electric motors (1) is configured according to claim 1.

* * * * *